US005563543A

United States Patent [19]
Martin

[11] Patent Number: 5,563,543
[45] Date of Patent: Oct. 8, 1996

[54] LOW-VOLTAGE BICMOS DIGITAL DELAY CHAIN SUITABLE FOR OPERATION OVER A WIDE POWER SUPPLY RANGE

[75] Inventor: Brian C. Martin, Albuquerque, N.M.

[73] Assignee: Philips Electronics North America Corporation, New York, N.Y.

[21] Appl. No.: 355,568

[22] Filed: Dec. 14, 1994

[51] Int. Cl.⁶ .......................... H03K 19/02; H03K 5/13
[52] U.S. Cl. ........................ 327/285; 327/262; 327/374
[58] Field of Search ............................. 327/276, 262, 327/263, 264, 277, 278, 281, 284, 285, 288, 374, 362, 378; 326/84, 110

[56] References Cited

U.S. PATENT DOCUMENTS

| | | | |
|---|---|---|---|
| 4,906,868 | 3/1990 | Maki et al. | 326/84 |
| 4,933,574 | 6/1990 | Lien et al. | 326/84 |
| 5,068,548 | 11/1991 | El Gamel | 326/110 |
| 5,079,447 | 1/1992 | Lien et al. | 326/110 |
| 5,198,704 | 3/1993 | Nitta et al. | 326/84 |
| 5,243,237 | 9/1993 | Khieu | 326/84 |
| 5,430,398 | 7/1995 | Cooper et al. | 326/110 |

Primary Examiner—Timothy P. Callahan
Assistant Examiner—Eunja Shin
Attorney, Agent, or Firm—Steven R. Biren

[57] ABSTRACT

A BiCMOS digital delay chain includes two signal paths coupled between an input terminal and an output terminal. The first signal path has two CMOS inverters coupled in series, while the second path has one CMOS inverter coupled to an BiNMOS inverter, with the latter being coupled to a BiCMOS pull-down circuit. By providing two signal paths between the input and output terminals of the delayed chain, a zero-static-power low-voltage circuit is obtained in which power-supply sensitivity is higher in one switching direction than in the other. This feature permits operation over a wide range of power supply potentials while minimizing changes in integrated circuit performance.

15 Claims, 2 Drawing Sheets

LOW-VOLTAGE BICMOS DIGITAL DELAY CHAIN SUITABLE FOR OPERATION OVER A WIDE POWER SUPPLY RANGE

BACKGROUND OF THE INVENTION

This invention is in the field of digital circuits, and relates more particularly to low-voltage BiCMOS digital delay chains suitable for operation over a wide power supply range.

Many low-voltage digital circuits are required to operate over a relatively wide range of power supply potentials, such as from about 2.3 volts up to about 3.6 volts. Difficulties have been experienced in designing digital integrated circuits to fit these low-voltage applications, because integrated circuit performance varies substantially with power supply potential. In particular, because of the difficulty in creating simple zero-static-power, low-voltage digital circuits, corrective design techniques are required. One such technique employs monostable multivibrators or "one-shots" which remain "on" longer as the power supply potential becomes lower in order to compensate for the loss of speed at lower power supply potentials. There is a problem, however, in designing "one-shots" which create substantially longer pulses at lower power supply potentials while maintaining a relatively constant maximum repetition frequency.

Optimally, it would be desirable to create digital delay chains which provide high power supply potential sensitivity while switching in one direction but not the other, so that the maximum repetition frequency stays substantially constant with changes in power supply potential. Additionally, the digital delay chain should have a greater delay sensitivity 0 to changes in power supply potential than to variations in fabrication process parameters.

Accordingly, it would be desirable to have a digital delay chain which is capable of providing a high sensitivity to power supply potential variations when switching in one direction but not the other, so that changes in integrated circuit performance with changes in power supply potential can be reduced. Additionally, it would be desirable to have a digital delay chain in which the sensitivity to power supply potential variations is substantially greater than the sensitivity to process parameter variations.

SUMMARY OF THE INVENTION

It is an object of the invention to provide a BiCMOS digital delay chain in which the sensitivity to power supply potential variations is greater when switching in one direction than in the other, in order to achieve compensation for changes in integrated circuit performance with variations in power supply potential and prevent the maximum repetition frequency from decreasing substantially as power supply potential drops.

It is a further object of the invention to provide a BiCMOS digital delay chain in which sensitivity to power supply potential variation is substantially greater than sensitivity to process parameter variation.

In accordance with the invention, these objects are achieved by a new BiCMOS digital delay chain having two signal paths between its input terminal and its output terminal. The first of these signal paths includes two CMOS inverters coupled in series, while the second path includes one CMOS inverter and a BiNMOS inverter, with the latter being coupled to a BiCMOS pull-down circuit which in turn is connected to the output terminal of the digital delay chain.

In a preferred embodiment of the invention, the first signal path includes first and second CMOS inverters directly connected in series, while a third CMOS inverter is provided in the second signal path.

In a further preferred embodiment of the invention, a single CMOS inverter is used as the first inverter in both signal paths, with the two signal paths being split after the BiNMOS inverter stage.

When the BiCMOS digital delay chain of the invention is used in low-voltage integrated circuit applications, it substantially improves the consistency of integrated circuit performance with varying power supply potential.

BRIEF DESCRIPTION OF THE DRAWING

The invention may be more completely understood with reference to the following detailed description, to be read in conjunction with the accompanying drawing, in which.

DESCRIPTION OF THE PREFERRED EMBODIMENTS

Figure 1A:
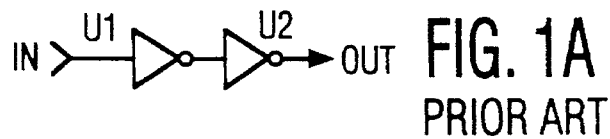
FIG. 1A shows a prior-art digital delay chain.

A common form of digital delay circuit may be formed from a chain of simple CMOS inverters, as shown in FIG. 1A. In FIG. 1A, two CMOS inverters U1 and U2 are connected in series between an input terminal IN and an output terminal OUT. Although two inverters are shown by way of example, it will be understood that a different number of inverters may be used, depending upon the magnitude of the delay desired and whether an inverted or noninverted output signal is desired.

Figure 1B:
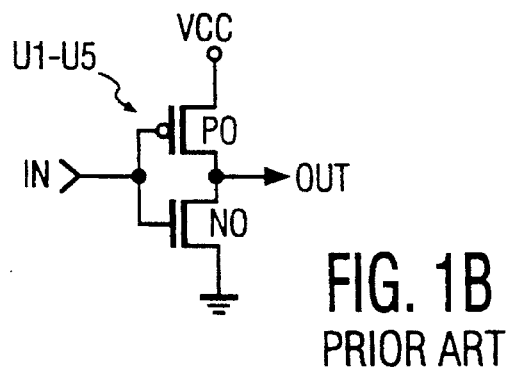
FIG. 1B shows a prior-art CMOS inverter suitable for use in the digital delay chain of FIG. 1A.

A simple prior-art CMOS inverter stage suitable for use in digital delay chains of both the prior art and the present invention is shown in FIG. 1B. The CMOS inverter, corresponding to inverters U1–U5 as used in the other Figures, includes an NMOS transistor NO and a PMOS transistor PO connected in series between a power supply terminal VCC and ground. The gates of the two MOS transistors are connected together and to an input terminal IN, and the common connection between the two MOS transistors in the series path serves as the inverter output OUT.

In the CMOS digital delay chain shown in FIG. 1A, as the power supply potential to the inverters U1, U2 is lowered, the time to propagate a signal through the digital delay chain goes up. Assuming that the inverter thresholds are equal, the time to propagate a high signal is substantially equal to the time to propagate a low signal, with both propagation delays increasing or decreasing substantially equally with changes in power supply potential.

However, for low-voltage applications designed to operate over a wide range of power supply potentials, it would be desirable to have as much power supply sensitivity as possible. This is difficult to achieve with the conventional digital delay chain of CMOS inverters as shown in FIG. 1A because any increase in power supply sensitivity will result in an equivalent (and undesirable) increase in process sensitivity.

Figure 2:
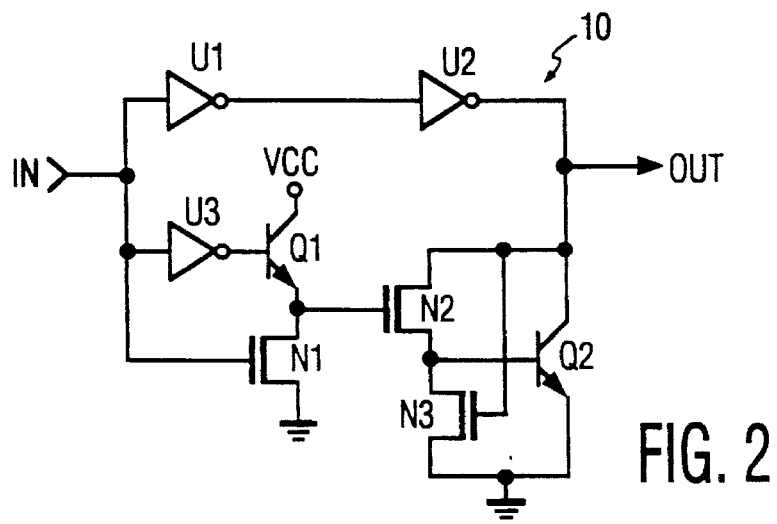
FIG. 2 shows a schematic diagram of a first embodiment of a BiCMOS digital delay chain in accordance with the invention.

A first embodiment of a low-voltage BiCMOS digital delay chain 10 in accordance with the invention and suitable for operation over a wide power supply range is shown in FIG. 2. This circuit includes first and second signal paths coupled between the input (IN) and output (OUT) terminals, with the first signal path being composed of two inverters U1 and U2 connected in series. The second signal path includes one CMOS inverter U3 having its input coupled to input terminal IN and its output coupled to the base of a bipolar transistor Q1. Bipolar transistor Q1, here an NPN transistor, has its main current path coupled in series with an NMOS transistor N1 to form a BiNMOS inverter circuit, with a gate of transistor N1 being connected to input terminal IN. The output terminal of the BiNMOS inverter, at the common connection between transistors Q1 and N1, is connected to the gate of an NMOS transistor N2, which, along with an NMOS transistor N3 and an NPN bipolar transistor Q2, forms a BiCMOS pull-down circuit. The main current path of transistor N2 is connected in series with the current path of transistor N3, and their common connection is coupled to the base of transistor Q2. The output of the BiCMOS pull-down circuit, at the collector of transistor Q2, is connected to the gate of transistor N3 and the drain of transistor N2, with this common connection being coupled to output terminal OUT. The sources of transistors N1 and N3, and the emitter of transistor Q2, are connected to ground, and the collector of transistor Q1 is connected to VCC. It should be noted that minor details of the circuit shown in FIG. 2 may be changed without departing from the spirit and scope of the invention so that, for example, the gate of transistor N3 could alternatively be connected to the gate of transistor N1, or else the transistor N3 could even be replaced by a simple resistor.

The circuit shown in FIG. 2 provides a BiCMOS digital delay chain which exhibits high power supply dependence without significantly increasing process susceptibility, and additionally provides much higher power-supply dependence when switching in one direction than in the other, thereby allowing the repetition frequency to remain relatively high as power supply potential is decreased. The two-inverter chain U1, U2 of FIG. 1A is used in the first signal path with the modification that the threshold of U2 is very high (which can be accomplished, for example, by making the NMOS transistor NO smaller than the PMOS transistor PO in FIG. 1B).

In operation, when the input to terminal IN has a transition from high to low, the input signal is propagated through both parallel signal paths. When the power supply potential is relatively high (for example 3.6 volts in a typical low-voltage application) the BiNMOS circuit pulls the gate of transistor N2 sufficiently high to generate a relatively large gate-to-source voltage, and transistor N2 in the second signal path then provides sufficient current to the base of transistor Q2 to ensure a fast high-to-low transition at the output terminal OUT. When the power supply potential is reduced, to about 2.3 volts in a typical low-voltage application, Q1 can no longer pull the gate of transistor N2 sufficiently high so that this transistor cannot provide sufficient current to the base of transistor Q2 to cause a fast high-to-low transition by virtue of the activation of transistor Q2. The high-to-low transition in the low-voltage condition is then provided by the NMOS transistor NO of CMOS inverter U2 in the first signal path. Since transistor NO is a relatively small device, the high-to-low transition at the output will take longer when the circuit is operating at the lower end of its power supply potential range. A low-to-high transition, on the other hand, is provided by the relatively larger PMOS transistor PO of U2 at both lower and higher power supply voltages, and is therefore much less sensitive to variations in power supply voltage. Thus, the circuit of the invention provides a BiCMOS digital delay chain which is highly sensitive to power supply variations during high-to-low transitions at its output, and is substantially less sensitive to changes in power supply potential during low-to-high output transitions. Additionally, process sensitivity of the circuit of the invention is not raised substantially as compared to the simple digital delay chain shown in FIG. 1A.

Figure 3:
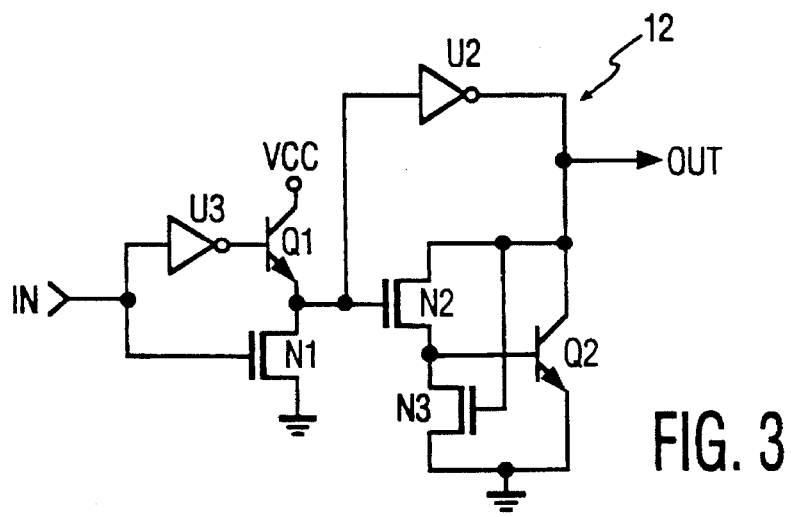
FIG. 3 shows a second embodiment of a BiCMOS digital delay chain in accordance with the invention.
Figure 4:
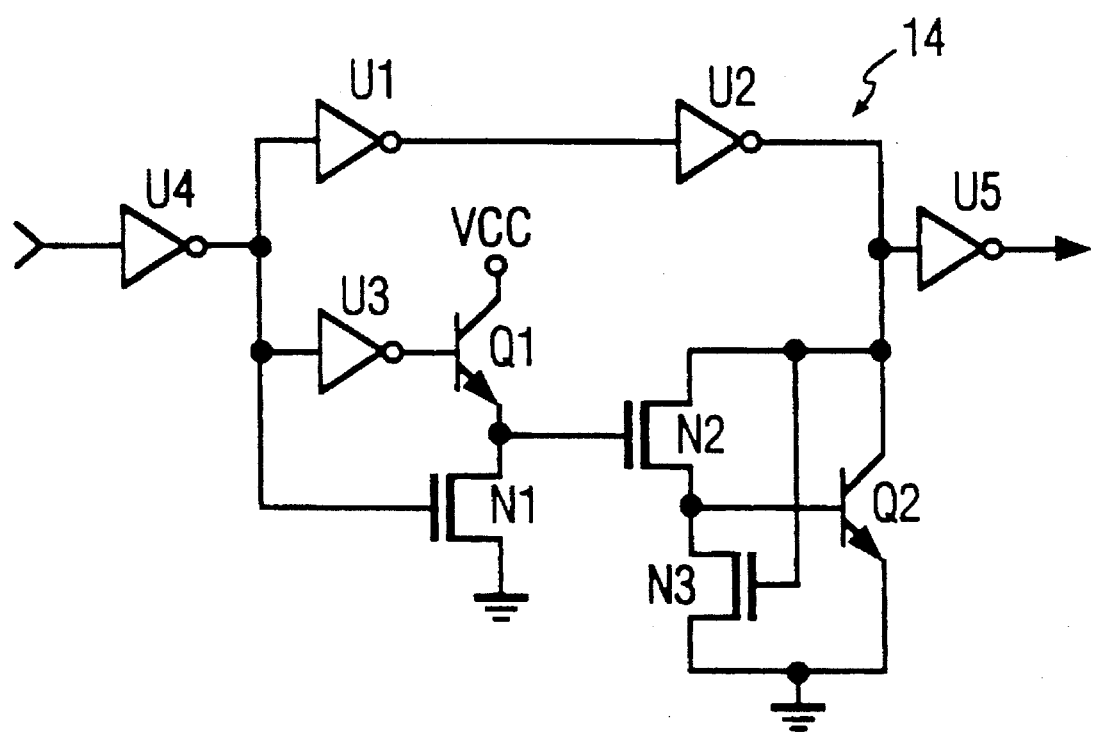
FIG. 4 shows a third embodiment of a BiCMOS digital delay chain in accordance with the invention.

Alternative circuit configurations for implementing the present invention are shown in FIGS. 3 and 4. In FIG. 3, a BiCMOS digital delay chain 12 has a similar configuration to that of the circuit shown in FIG. 2, but with the input of inverter U2 coupled to the output of inverter U3 through the base-emitter path of transistor Q1. In this manner the first signal path includes two signal inversions, as in FIG. 2, but the inverter U3 serves as the first inverter for both the first and the second signal paths, thus eliminating the need for a separate inverter U1 as in FIG. 2 and thereby simplifying the resulting circuit. In all other respects, the circuit of FIG. 3 is the same as that of FIG. 2.

FIG. 4 illustrates an embodiment in which a BiCMOS digital delay chain 14 includes a circuit such as that shown in FIG. 2 connected in series with additional inverter stages. Thus, the input terminal IN in this embodiment is connected to the input of a CMOS inverter U4, the output of which is connected to the inputs of CMOS inverters U1 and U3, while the output of inverter U2 and the collector of transistor Q2 are connected to the input of a CMOS inverter U5, the output of which is connected to the output terminal OUT. It should be understood that different numbers of inverters may be used on both the input and output ends of the circuit to secure either an inverted or a noninverted output, as well as to secure a desired degree of delay. For example, by using just one of the inverters U4 or U5, or any other odd number of inverters, the output signal will be an inverted as well as a delayed version of the input signal. Additionally, the portion of the circuit in FIG. 4 between the output of inverter U4 and U5 may be composed of the circuit of FIG. 3, instead of the circuit of FIG. 2 as shown.

In this manner, the present invention provides a BiCMOS digital delay chain in which the sensitivity to power supply potential variations is greater when switching in one direction than in the other, in order to achieve compensation for changes in integrated circuit performance with variations in power supply potential and prevent the maximum repetition frequency from decreasing substantially as power supply potential drops. Additionally, the invention provides a BiCMOS digital delay chain in which sensitivity to power supply potential variation is substantially greater than sensitivity to process parameter variation.

While the invention has been particularly shown and described with reference to several preferred embodiments thereof, it will be understood by those skilled in the art that various changes in form and detail may be made without departing from the spirit and scope of the invention.

What is claimed is:

1. A BiCMOS digital delay chain having an input terminal and an output terminal and comprising:

a first signal path from said input terminal to said output terminal and comprising first and second CMOS inverters coupled in series; and a second at least partly parallel signal path from said input terminal to said output terminal and comprising one CMOS inverter having an input coupled to said input terminal and a BiNMOS inverter having its input coupled to said input terminal, an output of said one CMOS inverter being coupled to a first bipolar transistor of said BiNMOS inverter, an output of said BiNMOS inverter being coupled to an input of a BiCMOS pull-down circuit, and an output of said BiCMOS pull-down circuit being coupled to said output terminal of the BiCMOS digital delay chain, said BiCMOS digital delay chain having a high sensitivity to power supply potential variations while switching from a first logic state to a second logic state and a low sensitivity to power supply potential variations while switching from the second to the first logic state.

2. A BiCMOS digital delay chain as in claim 1, wherein said first signal path comprises first and second CMOS inverters directly connected in series, and said one CMOS inverter in said second signal path comprises a third CMOS inverter.

3. A BiCMOS digital delay chain as in claim 1, wherein said first signal path comprises first and second CMOS inverters coupled in series by a base-emitter path of said bipolar transistor, and said first CMOS inverter of said first signal path comprises said one CMOS inverter of said second signal path.

4. A BiCMOS digital delay chain as in claim 1, wherein said BiNMOS inverter comprises said first bipolar transistor being an npn transistor and a first NMOS transistor having their main current paths connected in series at a first junction, the output of said one CMOS inverter being coupled to a base of said npn first bipolar transistor, said input terminal being coupled to a gate of said first NMOS transistor, and said first junction comprising the output of said BiNMOS inverter.

5. A BiCMOS digital delay chain as in claim 4, wherein said BiCMOS pull-down circuit comprises second and third NMOS transistors coupled in series at a second junction and a second npn bipolar transistor having a base terminal coupled to said second junction, a gate terminal of said second NMOS transistor being coupled to said first junction and a drain of said second NMOS transistor and a collector of said second npn bipolar transistor being coupled to said output terminal.

6. A BiCMOS digital delay chain as in claim 1, further comprising at least one further CMOS inverter having an output coupled to said input terminal.

7. A BiCMOS digital delay chain as in claim 1, further comprising at least one further CMOS inverter having an input coupled to said output terminal.

8. A BiCMOS digital delay chain as in claim 1, further comprising at least one further CMOS inverter coupled to said input terminal and at least one further CMOS inverter coupled to said output terminal.

9. An electronic circuit comprising logic circuitry characterized in that the logic circuitry provides high sensitivity to power supply potential variations while switching from a first logic state to a second logic state and a low sensitivity to power supply potential variations while switching from the second to the first logic stage, so that a maximum switching frequency of the circuit stays substantially constant with changes in power supply potential.

10. The circuit of claim 9, wherein the logic circuitry comprises:

an input (IN) for receiving a binary input signal;

an output (OUT) for providing a binary output signal; and first and second signal paths arranged in parallel between the input and the output, wherein:

the first path comprises an asymmetric first CMOS logic gate (U2) having a PFET (P0) and an NFET (N0) connected in series, the PFET being substantially larger in area than the NFET, and a common node of the PFET and the NFET being connected to the output; and the second path comprises a BiCMOS pull-down circuit (U3, Q1, N1, N2, N3, Q2) having a first bipolar transistor (Q2) with a main current path connected to the output and with a base electrode receiving a control current, the BiCMOS pull-down circuit being operative to supply the control current to the base electrode of the first bipolar transistor in response to the input signal, the control current being lower according as a supply voltage (Vcc) at a supply node of the circuit is lower.

11. The circuit of claim 10, wherein the BiCMOS pull-down circuit comprises:

a second CMOS logic gate (U3) having a gate input connected to the input;

a further bipolar transistor (Q1) whose base electrode is connected to a gate output of the second CMOS logic gate and whose main current path is connected to the supply node;

a second NFET (N1) whose control electrode receives the input signal and whose main current path is connected in series with the main current path of the further bipolar transistor; and a third NFET (N2) whose control electrode is connected to a further common node between the main current paths of the further bipolar transistor and the second NFET, and whose main current path is connected between the output and the base electrode of the first bipolar transistor.

12. The circuit of claim 11, wherein the first CMOS logic gate has an input connected to the further common node.

13. The circuit of claim 11, wherein a third CMOS logic gate (U1) is arranged between the input and a gate input of the first CMOS logic gate.

14. The circuit of claim 11, wherein a gate input of the first CMOS logic gate is coupled to the gate output of the second CMOS logic gate.

15. The circuit of claim 10, wherein at least one further CMOS logic gate is connected to at least one of the input and the output.

* * * * *